United States Patent
Iizuka et al.

(10) Patent No.: US 8,160,521 B2
(45) Date of Patent: Apr. 17, 2012

(54) MOBILE COMMUNICATION TERMINAL AND METHOD FOR CONTROLLING A PLURALITY OF RECEIVING APPARATUSES MOUNTED ON MOBILE COMMUNICATION TERMINAL

(75) Inventors: Yousuke Iizuka, Yokosuka (JP); Shinsuke Ogawa, Yokohama (JP); Masahiro Sakai, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 532 days.

(21) Appl. No.: 11/814,232

(22) PCT Filed: Jan. 17, 2006

(86) PCT No.: PCT/JP2006/300531
§ 371 (c)(1), (2), (4) Date: Jan. 25, 2008

(87) PCT Pub. No.: WO2006/077830
PCT Pub. Date: Jul. 27, 2006

(65) Prior Publication Data
US 2009/0054025 A1   Feb. 26, 2009

(30) Foreign Application Priority Data
Jan. 18, 2005 (JP) .................. 2005-010850

(51) Int. Cl.
*H04B 7/08* (2006.01)
*H04B 17/02* (2006.01)
*H04B 17/00* (2006.01)
*H04B 1/06* (2006.01)
*H04B 7/00* (2006.01)

(52) U.S. Cl. .............. 455/132; 455/136; 455/226.1; 455/232.1

(58) Field of Classification Search .......... 455/132, 455/136, 138, 232.1–253.2, 134, 226.1–226.2; 375/345
See application file for complete search history.

(56) References Cited

U.S. PATENT DOCUMENTS
5,263,180 A * 11/1993 Hirayama et al. ............ 455/139
5,513,222 A *  4/1996 Iwasaki ........................ 375/347
(Continued)

FOREIGN PATENT DOCUMENTS
CN   1122538 A   5/1996
(Continued)

OTHER PUBLICATIONS

Chinese Office Action issued Jul. 25, 2011, in Patent Application No. 200680002486.6 (with English-language translation).

(Continued)

*Primary Examiner* — Simon Nguyen
(74) *Attorney, Agent, or Firm* — Oblon, Spivak, McClelland, Maier & Neustadt, L.L.P.

(57) ABSTRACT

Signals are received with a wider power range even through the use of existing AGCs than by conventional mobile communication terminals. In an AGC on one antenna side, in order to enable reception of a signal at a higher level, a target TA of a dynamic range DA of this AGC is changed to a value 5 dB higher than a value defined as a standard TS. On the other hand, in an AGC on another antenna side, in order to enable reception of a signal at a lower level, a target TB of a dynamic range DB of this AGC is changed to a value 5 dB lower than the value defined as the standard TS.

16 Claims, 9 Drawing Sheets

U.S. PATENT DOCUMENTS

| | | | |
|---|---|---|---|
| 5,768,698 A * | 6/1998 | Kinoshita | 455/273 |
| 6,507,605 B1 | 1/2003 | Fukumoto et al. | |
| 6,963,733 B2 * | 11/2005 | Eriksson et al. | 455/132 |
| 7,336,743 B2 * | 2/2008 | Ma et al. | 375/345 |
| 7,373,126 B2 * | 5/2008 | Narita | 455/234.1 |
| 7,463,704 B1 * | 12/2008 | Tehrani et al. | 375/345 |
| 2003/0026363 A1 * | 2/2003 | Stoter et al. | 375/345 |
| 2004/0137857 A1 | 7/2004 | Seo | |
| 2004/0190658 A1 * | 9/2004 | Ohtaki et al. | 375/347 |
| 2005/0047533 A1 * | 3/2005 | Ruelke et al. | 375/345 |
| 2005/0239427 A1 * | 10/2005 | Inoue et al. | 455/232.1 |
| 2006/0165199 A1 * | 7/2006 | Takemoto et al. | 375/347 |

FOREIGN PATENT DOCUMENTS

| | | |
|---|---|---|
| EP | 0 700 184 A2 | 3/1996 |
| EP | 0 700 184 A3 | 3/1996 |
| JP | 63-1222 | 1/1988 |
| JP | 7 212158 | 8/1995 |
| JP | 8 79146 | 3/1996 |
| JP | 8-293825 | 11/1996 |
| JP | 9 284068 | 10/1997 |
| JP | 11 234055 | 8/1999 |
| JP | 2000 13159 | 1/2000 |
| JP | 2001 223549 | 8/2001 |
| JP | 2004-215246 | 7/2004 |
| KR | 10-2004-0063387 | 7/2004 |
| TW | 507429 | 10/2002 |
| TW | 569427 | 1/2004 |

OTHER PUBLICATIONS

European Office Action issued Feb. 15, 2011, in Patent Application No. 06711811.7-2411.

* cited by examiner

MOBILE COMMUNICATION TERMINAL AND METHOD FOR CONTROLLING A PLURALITY OF RECEIVING APPARATUSES MOUNTED ON MOBILE COMMUNICATION TERMINAL

TECHNICAL FIELD

The present invention relates to a mobile communication terminal equipped with a plurality of receivers and a method of controlling the plurality of receivers mounted on the mobile communication terminal.

BACKGROUND ART

In recent years, the Internet is spreading rapidly, so as to advance increase in multiplicity and volume of information. In conjunction therewith, research and development activities are also active on next-generation radio access systems for implementing high-speed wireless communication in the field of mobile communication. One of such next-generation radio access systems is, for example, an HSDPA (High Speed Downlink Packet Access) system using adaptive modulation and error correction coding (AMC: Adaptive Modulation and channel Coding) to determine the throughput according to a reception environment of a mobile communication terminal (mobile equipment). The use of this HSDPA system enables a dramatic improvement in throughput. However, the dramatic improvement in throughput requires mobile communication terminals with better reception sensitivity when compared to the conventional W-CDMA technology.

One of techniques for improving the reception sensitivity of the mobile communication terminal is the receiver diversity technology of equipping the mobile communication terminal with a plurality of receivers and combining or selecting signals received through a plurality of antennas. Patent Document 1 below discloses the technology about diversity reception.

Figure 1:
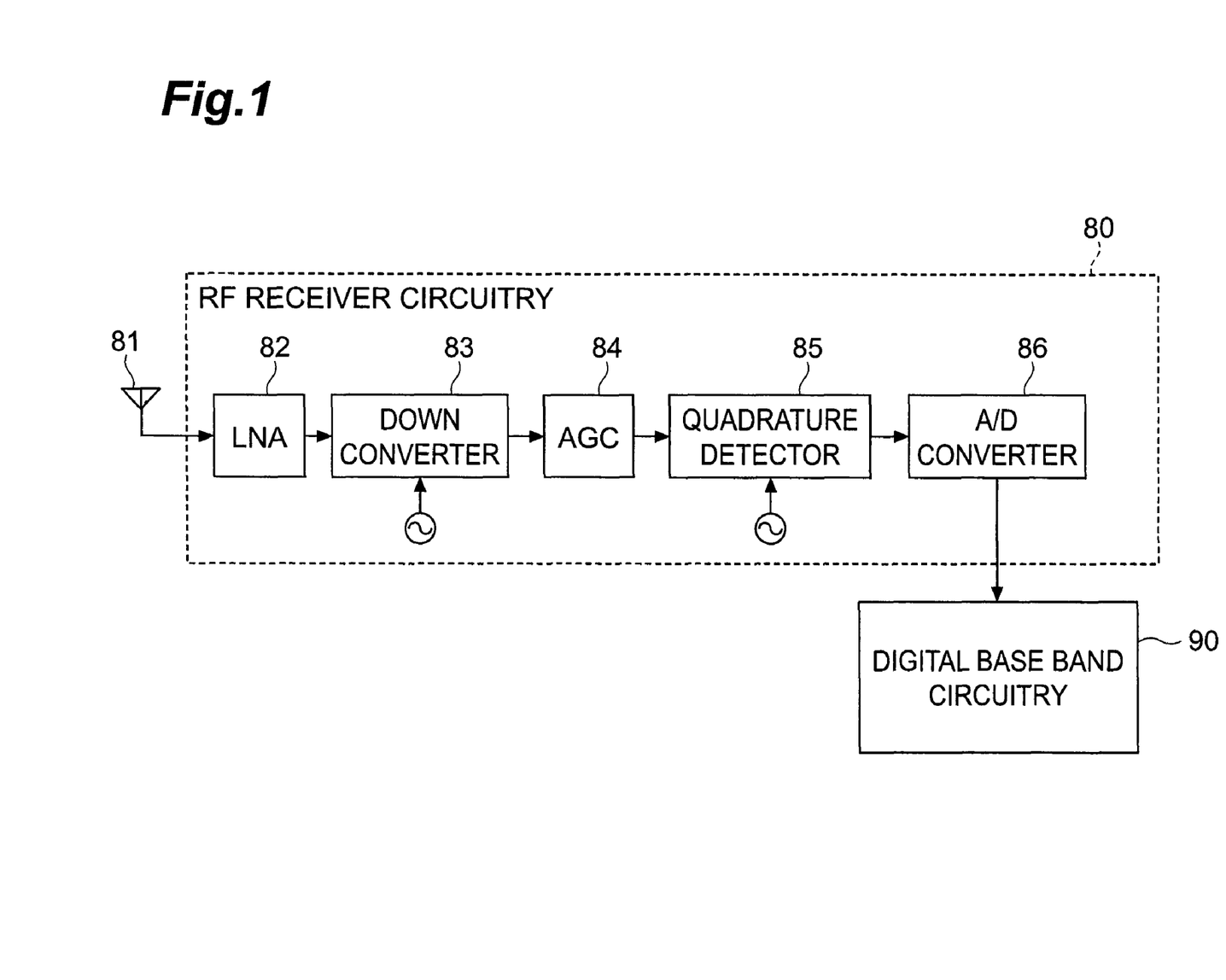
FIG. 1 is a drawing illustrating a circuit configuration of a conventional terminal without receiver diversity.

The flow of a signal processed in a conventional W-CDMA terminal will be described referring to a circuit configuration diagram of the W-CDMA terminal shown in FIG. 1 (which is a terminal without receiver diversity). First, a received signal received through antenna 81 is amplified still in the RF (Radio Frequency) band by LNA (Low Noise Amp; low noise amplifier) 82. Then the amplified signal is downconverted by Down converter (downconverter) 83, and this downconverted signal is linearly amplified by AGC (Automatic Gain Control; automatic gain control amplifier) 84. Next, the linearly amplified signal is subjected to quadrature detection by Quadrature detector (quadrature detection unit) 85, and this quadrature detected signal is converted into a digital signal by A/D converter 86. Thereafter, the converted digital signal is demodulated by Digital base band circuitry 90.

Patent Document 1: Japanese Patent Application Laid-open No. 8-79146

DISCLOSURE OF THE INVENTION

Problem to be Solved by the Invention

Figure 2:
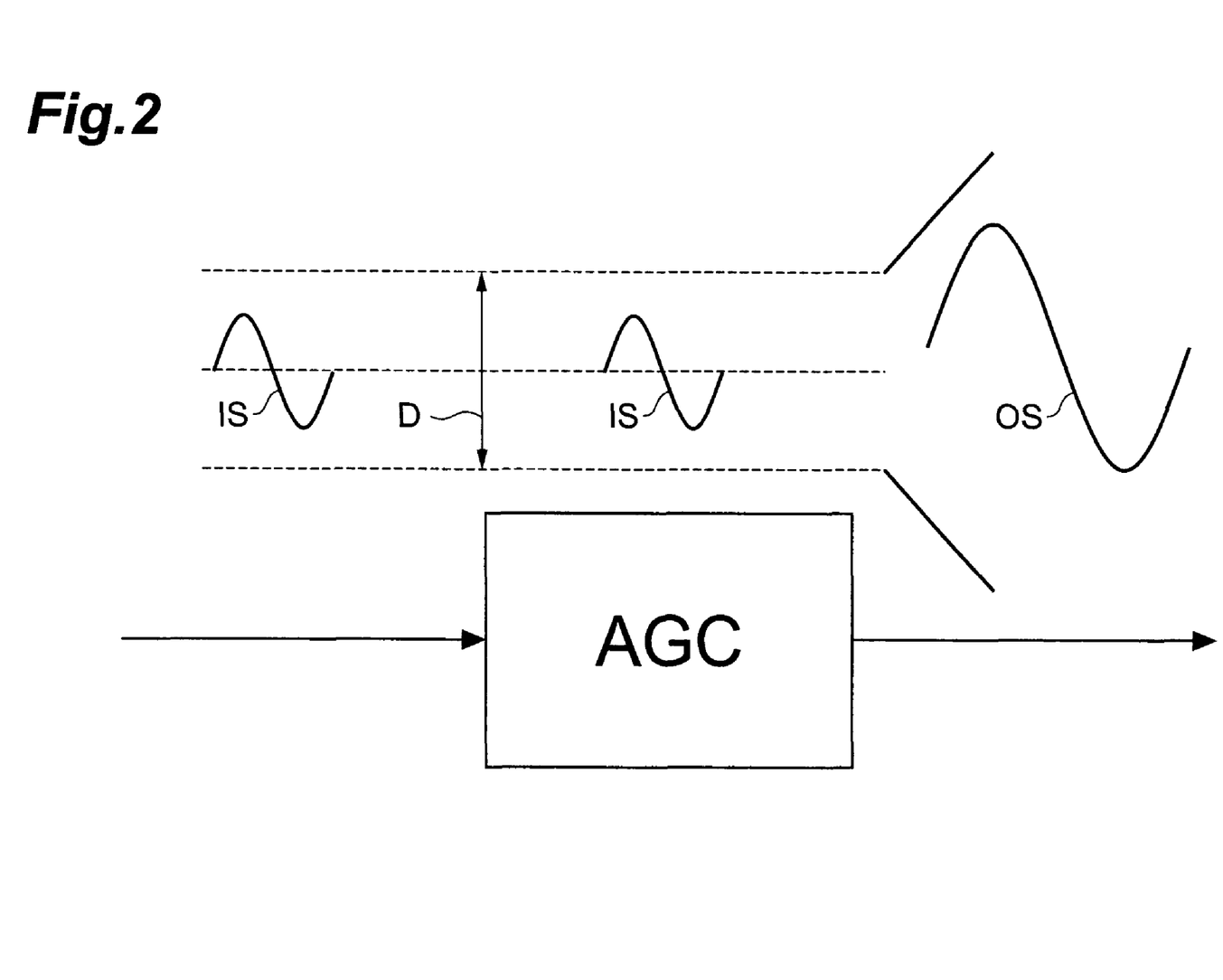
FIG. 2 is a drawing for explaining a signal transition state in a case where an input signal falls within a scope of a dynamic range of an AGC.

Incidentally, since the conventional W-CDMA system adopts transmission power control, the reception level of the mobile communication terminal normally falls within the scope of the dynamic range of AGC (permissible reception levels of input signal). In this case, as shown in FIG. 2, the input signal IS within the scope of dynamic range D is fed to AGC 84, and the output is thus a normally linearly amplified output signal OS.

Figure 3:
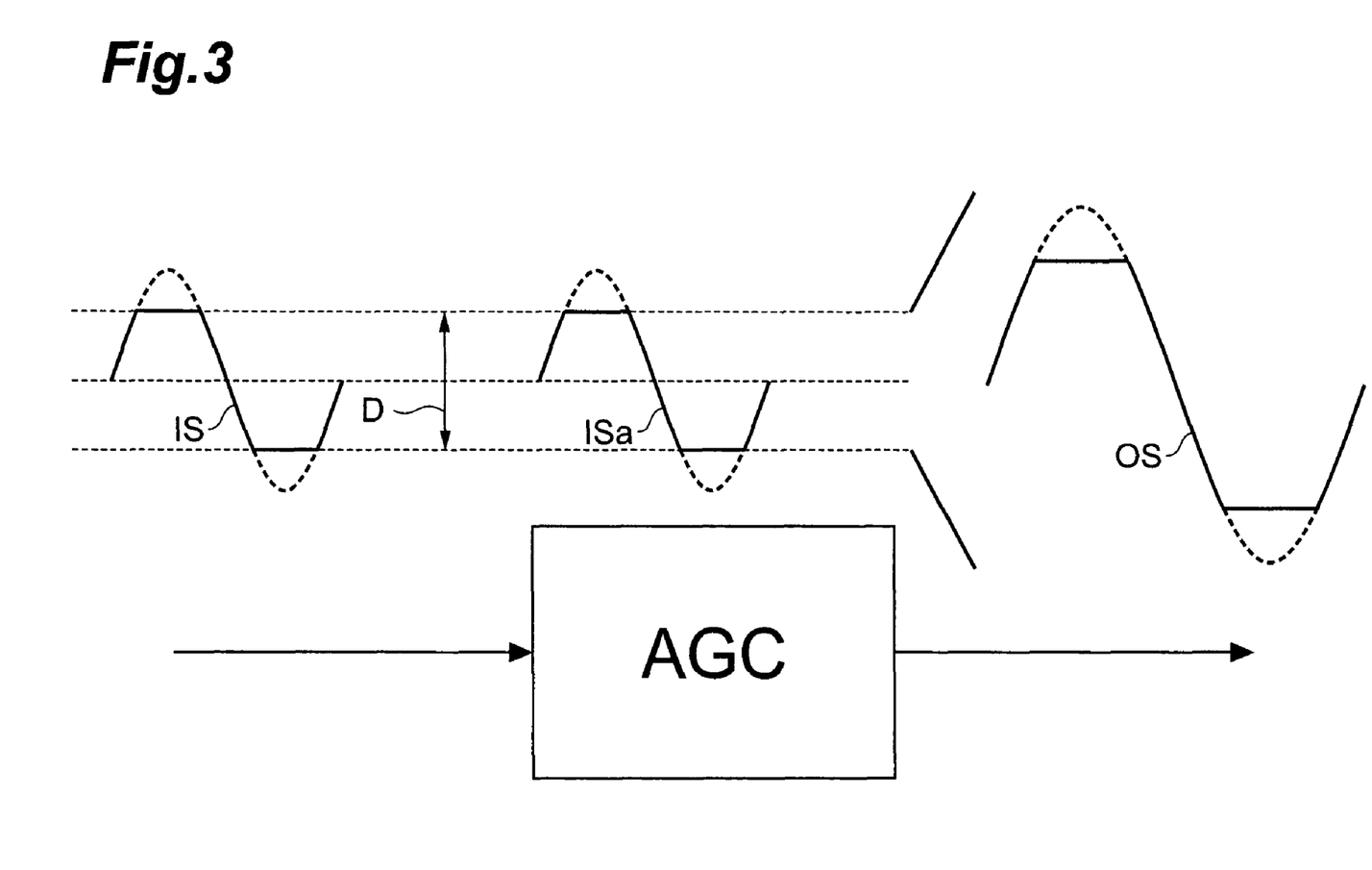
FIG. 3 is a drawing for explaining a signal transition state in a case where an input signal does not fall within a scope of a dynamic range of an AGC.

In contrast to it, the HSDPA system being one of the next-generation radio access systems adopts the AMC to determine the throughput according to a reception environment of the mobile communication terminal, instead of the transmission power control, and it could cause the reception level of the mobile communication terminal to deviate from the scope of dynamic range of AGC. In this case, as shown in FIG. 3, the input signal IS not falling within the scope of dynamic range D is fed to AGC 84. In this case, an object of linear amplification is only an input signal part ISa falling within the scope of dynamic range D, and the output signal OS after the linear amplification suffers distortion. This leads to degradation of characteristics and it will adversely affects the digital signal outputted thereafter from A/D converter 86.

This problem can be solved by widening the dynamic range of AGC more than normal. However, for widening the dynamic range, a new AGC has to be developed, which will cause difficulties and which will raise the cost of the terminal to be equipped with the AGC.

Means for Solving the Problem

An object of the present invention is therefore to provide a mobile communication terminal capable of receiving a signal with a wider power range, without widening of the dynamic range, and a method of controlling a plurality of receivers mounted on the mobile communication terminal, in order to solve the aforementioned problem.

A mobile communication terminal of the present invention is a mobile communication terminal of a diversity function mounted type with a plurality of receivers, wherein the receivers comprise their respective amplifiers for amplifying a received signal received through an antenna; and wherein among targets of dynamic ranges of the respective amplifiers, at least one target is changed by a predetermined value from a standard value.

A method of controlling a plurality of receivers mounted on a mobile communication terminal according to the present invention is a method of controlling a plurality of receivers mounted on a mobile communication terminal with a diversity function, wherein the receivers comprise an amplifying step of amplifying a received signal received through an antenna; and wherein among targets of dynamic ranges in the amplifying step, at least one target is changed by a predetermined value from a standard value.

These aspects of the invention enable reception of a signal with a wider power range, without widening of the dynamic range.

In the mobile communication terminal of the present invention, the foregoing predetermined value is preferably 5 dB. In the mobile communication terminal of the present invention, preferably, the receivers further comprise target changing means for changing the target when a reception level of the received signal does not fall within a scope of the dynamic range. In this case, for example, when the reception level deviates to the higher power side of the dynamic range, the target of the dynamic range can be changed to a value higher than the standard value; when the reception level deviates to the lower power side of the dynamic range, the target of the dynamic range can be changed to a value lower than the standard value. This allows the target of the dynamic range to be efficiently changed according to variation in the reception level.

Effect of the Invention

The mobile communication terminal and the method of controlling the plurality of receivers mounted on the mobile communication terminal according to the present invention enable reception of a signal with a wider power range, without widening of the dynamic range.

DESCRIPTION OF REFERENCE SYMBOLS

10 RF receiver circuitry; 11 antenna; 12 LNA; 13 Down converter; 14 AGC; 15 Quadrature detector; 16 A/D converter; 17 input unit; 18 AGC control unit; 20 Digital base band circuitry.

BEST MODE FOR CARRYING OUT THE INVENTION

Embodiments of the mobile communication terminal and the method of controlling a plurality of receivers mounted on the mobile communication terminal according to the present invention will be described below on the basis of the drawings. The same elements will be denoted by the same reference symbols throughout the drawings, without redundant description.

The mobile communication terminal in the present embodiment is equipped, for example, with the high-speed wireless communication function based on HSDPA and uses high-rate error correction code and multilevel modulation such as 16QAM (Quadrature Amplitude Modulation) or 64QAM to increase frequency utilization efficiency, thereby realizing fast wireless communication. The mobile communication terminal available herein is, for example, a cell phone, a personal handyphone system (PHS), a personal digital assistance with a communication function (PDA), or the like.

Figure 4:
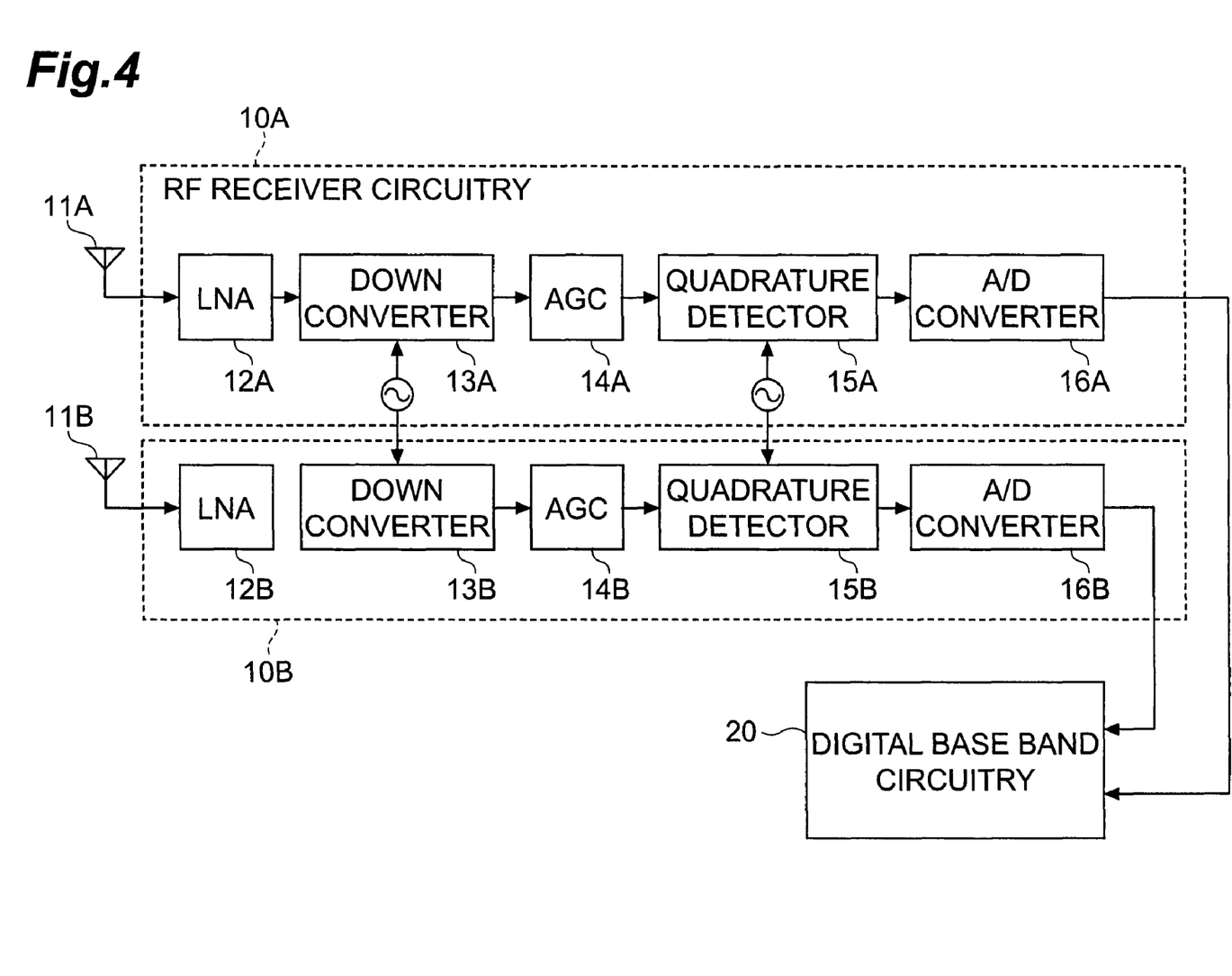
FIG. 4 is a drawing illustrating a circuit configuration of a receiver part of a mobile communication terminal in an embodiment.

FIG. 4 is a drawing illustrating a circuit configuration of a receiver part of the mobile communication terminal in the embodiment. As shown in FIG. 4, the receiver part of the mobile communication terminal has two RF receiver circuitries (RF receiving circuits) 10A, 10B (receivers) with the diversity function, and a Digital base band circuitry (digital baseband circuit) 20 for performing a demodulation process based on digital signals outputted from the respective RF receiver circuitries 10. The RF receiver circuitry 10A functions as a main receiver that always receives an RF signal transmitted from a base station, and the RF receiver circuitry 10B functions as an auxiliary receiver that receives an RF signal only when the diversity function is active.

The mobile communication terminal does not always have to be equipped with only two RF receiver circuitries 10, but may be equipped with three or more RF receiver circuitries. Namely, the mobile communication terminal may be arranged to combine or select signals outputted from a plurality of RF receiver circuitries 10 so as to implement the diversity function. The diversity function may be arranged so as to be always active.

Each RF receiver circuitry 10 has antenna 11, LNA (Low Noise Amp; low noise amplifier) 12, Down converter 13, AGC (Automatic Gain Control; automatic gain control amplifier) 14, Quadrature detector 15, and A/D converter 16.

LNA 12 amplifies an RF signal received through antenna 11, still in the RF band. Down converter 13 converts the signal amplified by LNA 12, into one of intermediate frequencies (baseband). AGC 14 linearly amplifies the signal converted by Down converter 13. Quadrature detector 15 performs quadrature detection based on the signal amplified by AGC 14. A/D converter 16 converts the analog signal after the quadrature detection by Quadrature detector 15, into a digital signal.

The mobile communication terminal in the present embodiment is characterized in that a target of a dynamic range of each AGC 14A, 14B is preliminarily changed as shifted by a predetermined value from a standard value.

Figure 7:
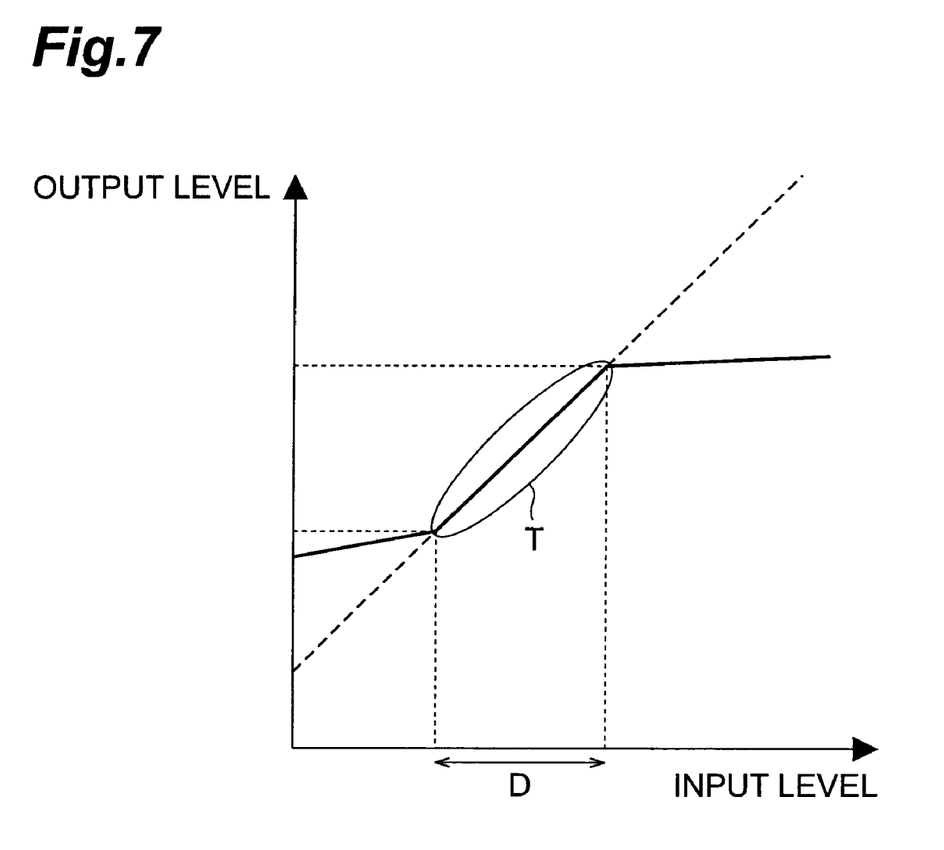
FIG. 7 is a drawing for explaining a dynamic range and a target.

The dynamic range and target will be described with reference to FIG. 7. As shown in FIG. 7, the dynamic range D is represented by input levels of an input signal permitted in AGC 14, and the target T by a linear function of input level and output level in the dynamic range D.

The predetermined value for the shift of the target from the standard value is, for example, 5 dB, but this shift value is not limited to 5 dB. The preferred change is a shift within a scope which can make the both dynamic ranges DA, DB continuous. Namely, the preferred change is a shift within a scope where the targets of the both dynamic ranges DA, DB are continuous. The reason for it is as follows: if the targets of the respective dynamic ranges DA, DB are separated from each other, there will be a gap between the targets and an input signal falling in this gap will not be contained in either of the dynamic ranges DA, DB, which will make it difficult to generate a synthetic signal without distortion.

The following methods are available as methods of changing the target.

The first method is a method of changing one of the targets of the dynamic ranges of respective AGCs 14A, 14B to a value higher than the standard value and changing the other target to a value lower than the standard value. In the present embodiment, the description hereinafter will be given using this first method.

The second method is a method of keeping one of the targets of the dynamic ranges of respective AGCs 14A, 14B at the standard value without change and changing the other target to a value higher than or lower than the standard value. When the diversity function is deactivated, the side of auxiliary receiver circuitry 10B is terminated in general. The mobile communication terminal of this configuration may be arranged to shift only the target of the dynamic range of AGC 14B provided on the side of auxiliary receiver circuitry 10B. This permits the target of the dynamic range on the side of main receiver circuitry 10A to be maintained in the optimal setting as before, which can minimize a drop of reception performance during deactivation of the diversity function.

Figure 5:
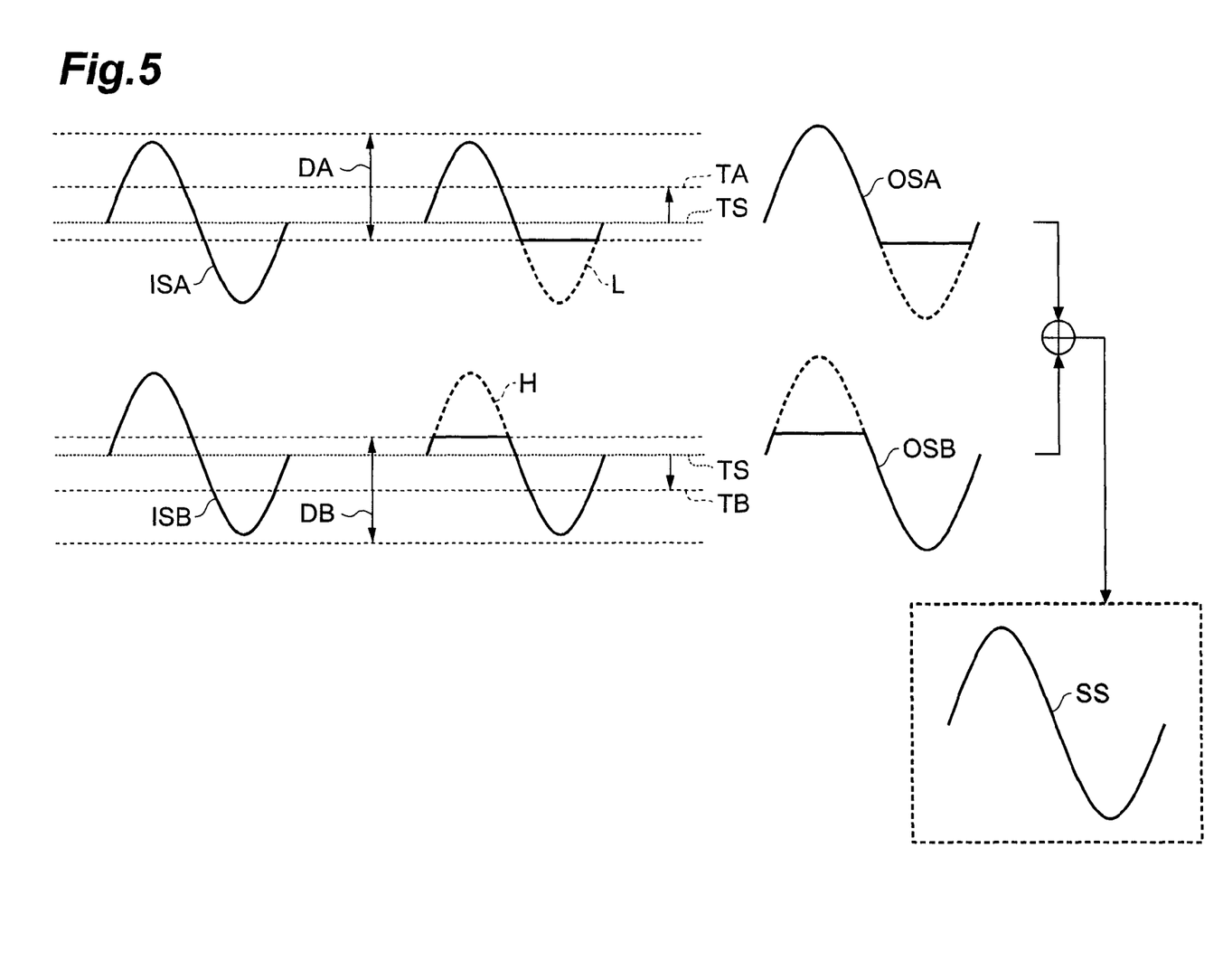
FIG. 5 is a drawing schematically illustrating a signal transition state in a case where input signals are amplified with changes in targets of dynamic ranges of AGCs.
Figure 6:
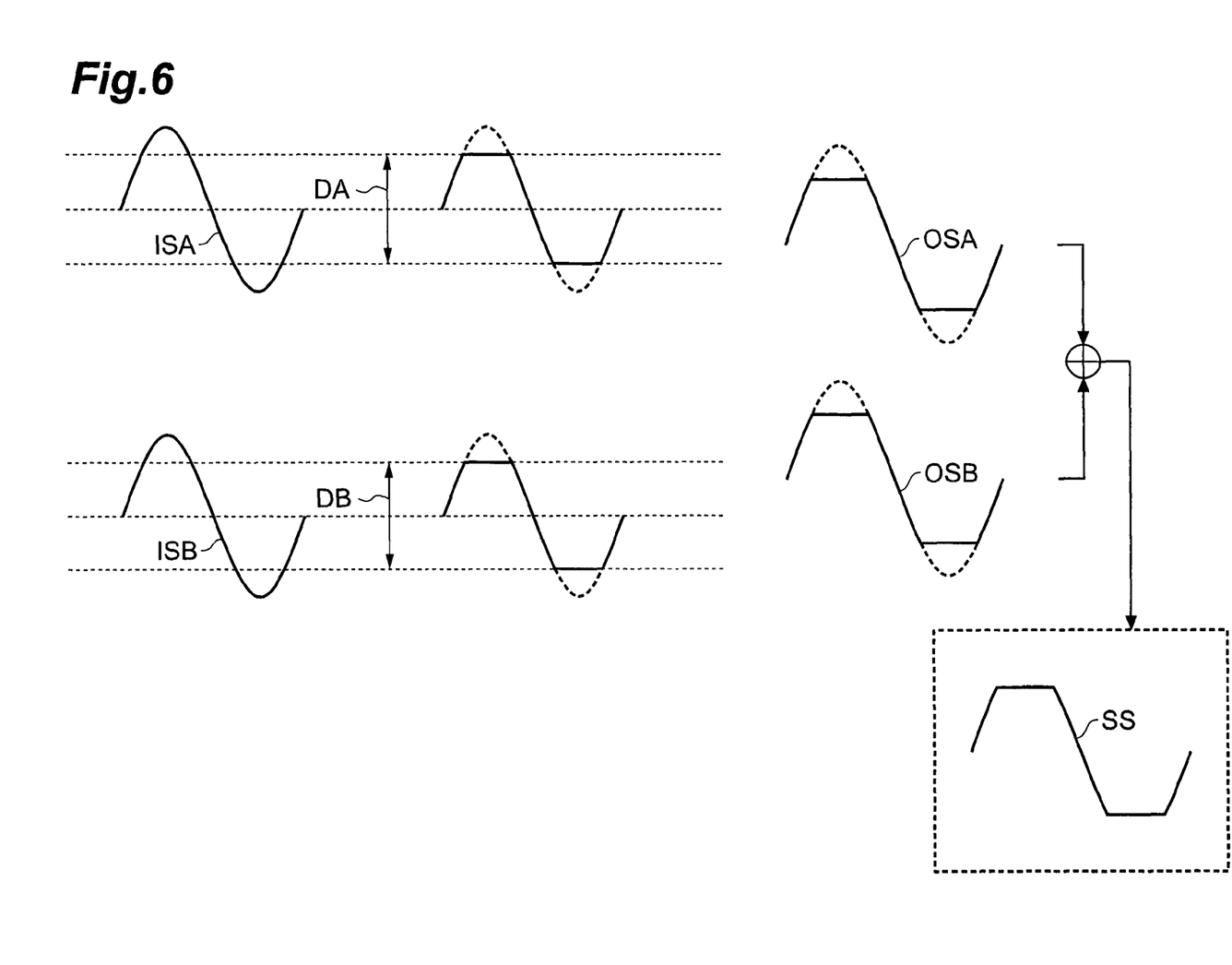
FIG. 6 is a drawing schematically illustrating a signal transition state in a case where input signals are amplified without any change in targets of dynamic ranges of AGCs.

The following will describe amplification processes in a case where the targets of dynamic ranges are changed as shifted from the standard value (the present invention) and in a case where they are kept unchanged (conventional technology), with reference to FIGS. 5 and 6.

FIG. 5 is a drawing schematically illustrating a signal transition state in the case where input signals are amplified with changes in the targets of dynamic ranges, and FIG. 6 a drawing schematically illustrating a signal transition state in the case where input signals are amplified without any change in the targets of dynamic ranges.

Input signal ISA shown in FIG. 5 is a signal that is received through antenna 11A and that is fed thereafter to AGC 14A. Input signal ISB is a signal that is received through antenna 11B and that is fed thereafter to AGC 14B. Dynamic range DA is a dynamic range of AGC 14A, and dynamic range DB a dynamic range of AGC 14B. Output signal OSA is a signal outputted from AGC 14A, and output signal OSB a signal outputted from AGC 14B. Synthetic signal SS is a signal after a combining process of the output signal OSA and output signal OSB in Digital base band circuitry 20.

The target TA of dynamic range DA shown in FIG. 5 is changed to a value higher than the value of standard TS, and the target TB of dynamic range DB is changed to a value lower than the value of standard TS. Specifically, for example, when each of the dynamic ranges DA, DB is supposed to be 60 dB, the target of dynamic range DA is changed to a value 5 dB higher than the standard value, and the target of dynamic range DB is changed to a value 5 dB lower than the standard value. In this case, the targets overlap each other by 50 dB.

As shown in FIG. 5, the waveforms of input signals ISA, ISB do not fit in the scope of dynamic range DA, DB. However, portions outside the scope of dynamic range DA, DB are different portions in the input signals ISA, ISB. Namely, the portion of input signal ISA outside the scope of dynamic range DA is part L at the low reception level, while the portion of input signal ISB outside the scope of dynamic range DB is part H at the high reception level. Therefore, the output signal OSA after the linear amplification in AGC 14A is outputted as a signal distorted in the part at the low reception level, and the output signal OSB after the linear amplification in AGC 14B is outputted as a signal distorted in the part at the high reception level. As a result, the output signal SS synthesized in Digital base band circuitry 20 suffers no distortion. This is because the output signals OSA, OSB distorted at the different places are combined to compensate for their respective distortions, so as to cancel the distortions. The reception level herein refers to a received power, a received field intensity, or the like.

When the targets of the dynamic ranges are changed as shifted from the standard value as described above, the mobile communication terminal can enjoy the same effect as in the case where the scope of dynamic range is expanded, and can obtain a combined gain by the diversity function in the overlap scope of the dynamic ranges.

On the other hand, the target of the dynamic range DA and the target of dynamic range DB shown in FIG. 6 are maintained at the standard value and at the same level. As shown in FIG. 6, the waveforms of input signals ISA, ISB do not fit in the scope of dynamic range DA, DB. Therefore, AGCs 14A, 14B linearly amplify only input signals included in the scope of dynamic range DA, DB. This results in outputting signals distorted in the part at the high reception level and in the part at the low reception level, as the output signals OSA, OSB outputted from AGCs 14A, 14B. As a result, the synthetic signal SS after combining of them in Digital base band circuitry 20 is also a signal distorted in the part at the high reception level and in the part at the low reception level.

Modification Examples

The method of changing the targets of dynamic ranges of AGCs 14A, 14B by shifting them is not limited to the above-described method. For example, the targets of dynamic ranges may be changed by various modification examples described below.

Figure 8:
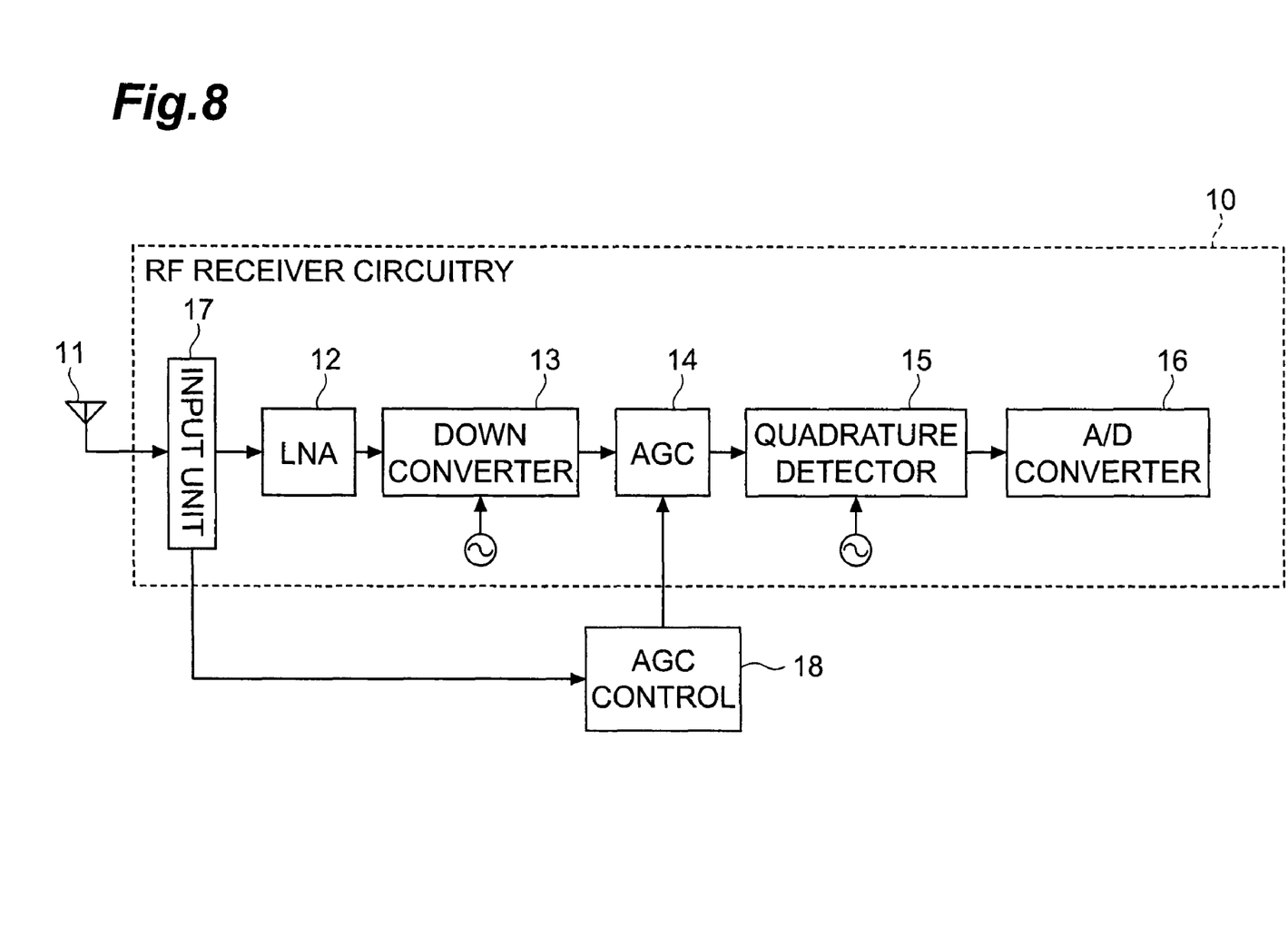
FIG. 8 is a drawing illustrating a circuit configuration of an RF receiver circuitry in a modification example.

The first available method is such that the reception level of the received signal received through antenna 11 is monitored and when the reception level deviates from the scope of the dynamic range, the target of the dynamic range is changed as shifted from the standard value. A circuit configuration of the RF receiver circuitry in this modification example will be described with reference to FIG. 8. The RF receiver circuitry 10 shown in FIG. 8 corresponds to the RF receiver circuitry 10A or RF receiver circuitry 10B shown in FIG. 4. The RF receiver circuitry 10 shown in FIG. 8 is different from the RF receiver circuitry 10A or RF receiver circuitry 10B shown in FIG. 4 in that the RF receiver circuitry 10 shown in FIG. 8 has input unit 17 and AGC control unit 18 (target changing means).

The input unit 17 monitors the reception level of the received signal received through antenna 11 and determines whether the reception level deviates from the scope of the dynamic range of AGC 14. When the input unit 17 determines that the reception level deviates from the scope of the dynamic range of AGC 14, it notifies the AGC control unit 18 of the reception level. The function of this input unit 17 may be included in the function of LNA 12.

The AGC control unit 18 changes the target of the dynamic range by shifting it from the standard value, based on the reception level notified of by the input unit 17. Specifically, when the reception level deviates to the higher power side of the dynamic range, the AGC control unit 18 changes the target of the dynamic range to a value higher than the standard value. On the other hand, when the reception level deviates to the lower power side of the dynamic range, the AGC control unit 18 changes the target of the dynamic range to a value lower than the standard value. When the reception level deviates to the higher power side and the lower power side of the dynamic range, the AGC control unit 18 changes the target to either a value higher than or a value lower than the standard value. In this case, to which side the target should be changed can be preliminarily set.

When there are a plurality of RF receiver circuitries, the change can be made as follows.

Figure 9:
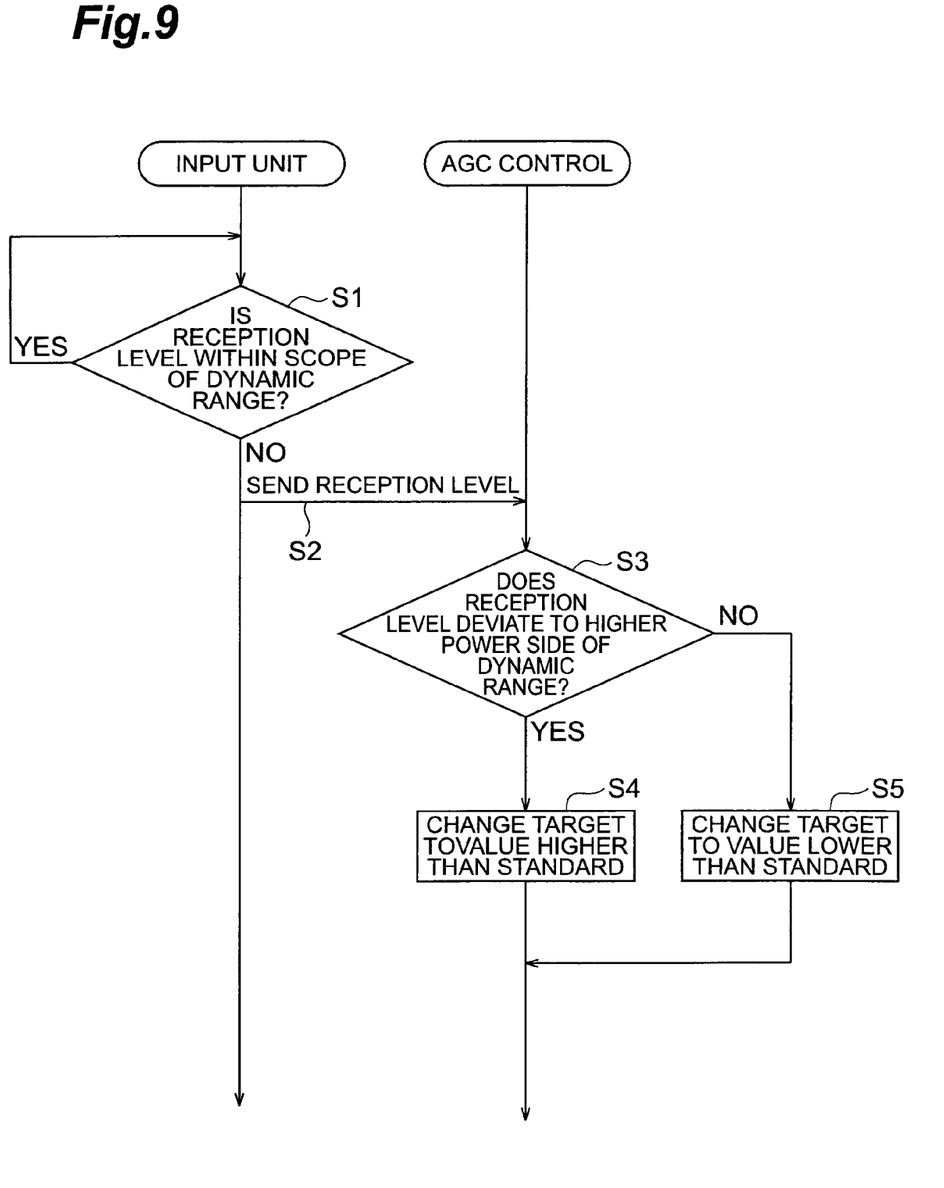
FIG. 9 is a sequence chart for explaining an operation in an input unit and an AGC control unit in the modification example.

The first change method is a method of changing only the target of the dynamic range of any one of the RF receiver circuitries and maintaining the targets of the dynamic ranges of the other RF receiver circuitries at the standard value without change. An operation in input unit 17 and AGC control unit 18 by this first method will be described with reference to FIG. 9. First, the input unit 17 determines whether the reception level of the received signal received through antenna 11 is within the scope of the dynamic range of AGC 14 (step S1). When this determination is YES (step S1; YES), the input unit 17 transfers processing to step S1. On the other hand, when the determination in step S1 is NO (step S1; NO), the input unit 17 sends the reception level to AGC control unit 18 (step S2). Then the AGC control unit 18 determines whether the reception level sent by the input unit 17 deviates to the higher power side of the dynamic range (step S3). When this determination is YES (step S3; YES), the AGC control unit 18 changes the target of the dynamic range to a value higher than the standard value (step S4). On the other hand, when the determination in step S3 is NO (step S3; NO), the AGC control unit 18 changes the target of the dynamic range to a value lower than the standard value (step S5).

The second change method is a method of changing only the targets of dynamic ranges of any two RF receiver circuitries as described below and maintaining the targets of dynamic ranges of the other RF receiver circuitries at the standard value without change. The second change method involves preliminarily setting an RF receiver circuitry to change the target to a value higher than the standard value and an RF receiver circuitry to change the target to a value lower than the standard value. When the reception level deviates to the higher power side of the dynamic range, the target of the dynamic range on the RF receiver circuitry side to change the target to the value higher than the standard value is changed to the value higher than the standard value. On the other hand, when the reception level deviates to the lower power side of the dynamic range, the target of the dynamic range on the RF receiver circuitry side to change the target to the value lower than the standard value is changed to the value lower than the standard value. When the reception level deviates to the higher power side and the lower power side of the dynamic range, the target of the dynamic range on the RF receiver circuitry side to change the target to the value higher than the standard value is changed to the value higher than the standard value, and the target of the dynamic range on the RF receiver circuitry side to change the target to the value lower than the standard value is changed to the value lower than the standard value.

The following will describe another modification example of changing the targets of the dynamic ranges by shifting them.

First, the targets may be changed as shifted so as to match the target of the dynamic range in LNA 12A, 12B connected to the input side (antenna 11 side) of AGC 14A, 14B. For example, when the dynamic range of LNA is 100 dB and each dynamic range of AGC is 60 dB, the targets are shifted so that the total dynamic range of AGCs becomes 100 dB. In this case, the targets overlap each other by 20 dB. This permits the signals amplified in LNAs 12A, 12B to be linearly amplified without loss, so as to prevent degradation of characteristics in AGCs 14A, 14B.

The targets may also be changed as shifted so that the targets of the respective dynamic ranges do not overlap and so that the targets are continuous to each other. For example, when each dynamic range is 60 dB, the dynamic range after the shift is 120 dB. This expands the scope of the dynamic ranges substantially to double, and enables reception of a signal with a wider power range.

As described above, the mobile communication terminal of the present invention was arranged to shift the target of one dynamic range or the targets of plural dynamic ranges, so as to widen the dynamic range of the entire mobile communication terminal. This enabled reception of a signal with a wider power range, without widening of the dynamic range used heretofore.

Finally, the mobile communication terminal of the present invention is the mobile communication terminal equipped with a plurality of receivers having the receiver diversity function, which is characterized in that the target of the dynamic range of AGC is shifted by 5 dB for each receiver. The method of changing the value of the dynamic range target of AGC for each antenna according to the present invention will be described with reference to FIG. 5. As shown in FIG. 5, AGC 14A on the antenna 11A side changes the target of the dynamic range of AGC 14A to a value 5 dB higher so as to permit reception of a signal at a higher level. On the other hand, AGC 14B on the antenna 11B side changes the target of the dynamic range of AGC 14B to a value 5 dB lower so as to permit reception of a signal at a low level. Although the signal is distorted in the part at the lower reception level by use of the target at the higher level on the antenna 11A side (while the signal is distorted at the higher level on the antenna 11B side by use of the target at the lower level), the receiver diversity involves combining of signals from the respective antennas and thus the signal after the combining can be less affected by distortion, when compared with the amplified signal without change in the normal dynamic range target (cf. FIG. 6) (noting, however, that the receiver diversity is originally to combine signals in the digital base band circuitry but FIGS. 5 and 6 show the form of combining waveforms for easier understanding). This configuration enables reception of a signal with a wider power range, when compared with the conventional mobile communication terminals, without change in the dynamic range of AGC 14. However, since the function of receiver diversity can be disconnected in general, an effective method is to change only the dynamic range target of the diversity antenna to a higher level while keeping the target of the main antenna as before.

The invention claimed is:

1. A mobile communication terminal comprising:
   a plurality of receivers mounted on the mobile communication terminal, each including a diversity function;
   a plurality of amplifiers included in each of the plurality of receivers, the plurality of amplifiers configured to amplify a signal received through an antenna of each receiver, wherein the plurality of amplifiers have a dynamic range and a target of the dynamic range; and
   a target changing unit configured to shift the target of the dynamic range of at least one of the plurality of amplifiers of at least one of the plurality of receivers by a predetermined value when a reception level of the signal received through the antenna of the receiver does not fall within the dynamic range,
   wherein the dynamic range defines permissible upper and lower limits on a reception level of an input signal to each of the plurality of amplifiers and the target of the dynamic range is a discrete value within the dynamic range.

2. The mobile communication terminal according to claim 1, wherein the predetermined value is 5 dB.

3. The mobile communication terminal of claim 1, further comprising:
   an input unit configured to determine whether the reception level of the signal received through the antenna of one of the plurality of receivers is within the dynamic range of one of the plurality of amplifiers of the receiver.

4. The mobile communication terminal of claim 3, wherein the input unit sends the reception level of the signal received through the antenna to the target changing unit when the reception level of the signal received through the antenna is not within the dynamic range of the amplifier.

5. The mobile communication terminal of claim 3, wherein the target changing unit determines a position of the reception level of the signal relative to the dynamic range of the amplifier.

6. The mobile communication terminal of claim 5, wherein the target changing unit increases the target of the dynamic range of the amplifier when the position of the reception level of the signal is higher than the dynamic range and reduces the target of the dynamic range of the amplifier when the position of the reception level of the signal is lower than the dynamic range of the amplifier.

7. The mobile communication terminal of claim 5, wherein the target changing unit changes the target of the dynamic range of the amplifier to one of a higher value and a lower value when the reception level of one portion of the signal is higher than the dynamic range of the amplifier and the reception level of another portion of the signal is lower than the dynamic range of the amplifier.

8. The mobile communication terminal of claim 1, wherein the target changing unit changes the targets of the dynamic ranges of the amplifiers so that the dynamic ranges of the amplifiers do not overlap and are continuous with respect to each other.

9. The mobile communication terminal of claim 1, wherein the target of the dynamic range of the amplifier is preliminarily set to a second predetermined value based on the signal received through the antenna of the receiver.

10. The mobile communication terminal of claim 1, wherein the target changing unit increases the target of the dynamic range of one of the plurality of amplifiers of one of the plurality of receivers when the signal received through the antenna of the receiver is on a high side of the dynamic range of the amplifier and the target changing unit decreases the target of the dynamic range of the amplifier when the signal received through the antenna of the receiver is on a low side of the dynamic range of the amplifier.

11. The mobile communication terminal of claim 1, wherein the target changing unit increases a target of the dynamic range of an amplifier of one of the plurality of receivers and the target changing unit decreases a target of the dynamic range of an amplifier of another of the plurality of receivers when a first portion of the signal received through the antenna of said one of the plurality of receivers is on a higher side of the dynamic range of the amplifier of said one of the plurality of receivers and a second portion of the signal received through the antenna of said another of the plurality of receivers is on a lower side of the dynamic range of the amplifier of said another of the plurality of receivers.

12. The mobile communication terminal of claim 1, wherein the target changing unit is configured to change the target of the dynamic range of one of the plurality of amplifiers of one of the plurality of receivers to match the target of the dynamic range of another of the plurality of amplifiers of the receiver.

13. The mobile communication terminal according to claim 1, further comprising an input unit configured to monitor a reception level of a signal received through the antenna of the receiver and to determine whether the reception level of the signal received through the antenna deviates from a scope of the dynamic range of one of the plurality of amplifiers of the receiver,
wherein the target changing unit shifts the target of the dynamic range in response to a determination by the input unit that the reception level of the received signal deviates from the scope of the dynamic range, and
the target changing unit shifts the target of the dynamic range by changing the target of the dynamic range from a standard value based on the reception level of the received signal.

14. The mobile communication terminal of claim 13, wherein
the target changing unit changes the target of the dynamic range to a value higher than the standard value in response to the reception level of the received signal deviating on a higher power side of the dynamic range, and
the target changing unit changes the target of the dynamic range to a value lower than the standard value in response to the reception level of the received signal deviating on a lower power side of the dynamic range.

15. The mobile communication terminal of claim 13, wherein
the target changing unit changes the target of the dynamic range to one of a value higher than the standard value and a value lower than the standard value in response to the reception level of the received signal deviating on a higher power side and a lower power side of the dynamic range.

16. A method of controlling a plurality of receivers mounted on a mobile communication terminal with a diversity function comprising:
amplifying, by the plurality of receivers, a signal received through an antenna of the plurality of receivers; and
shifting a target of a dynamic range of at least one of a plurality of amplifiers included in at least one of the plurality of receivers by a predetermined value when a reception level of the signal received through the antenna of the receiver is not within the dynamic range of the amplifier,
wherein the dynamic range defines permissible upper and lower limits on a reception level of an input signal to each of the plurality of amplifiers and the target of the dynamic range is a discrete value within the dynamic range.

* * * * *